United States Patent [19]

Gofuku et al.

[11] Patent Number: 4,886,977

[45] Date of Patent: Dec. 12, 1989

[54] PHOTOELECTRIC CONVERTER PROVIDED WITH VOLTAGE DIVIDING MEANS

[75] Inventors: Ihachiro Gofuku, Hiratsuka; Yoshiyuki Osada, Atsugi; Katsumi Nakagawa, Nagahama; Katsunori Hatanaka, Yokohama; Toshihiro Saika; Noriyuki Kaifu, both of Hiratsuka, all of Japan

[73] Assignee: Canon Kabushiki Kaisha, Tokyo, Japan

[21] Appl. No.: 117,957

[22] Filed: Nov. 9, 1987

[30] Foreign Application Priority Data

Nov. 11, 1986 [JP] Japan ............... 61-266666
Dec. 25, 1986 [JP] Japan ............... 61-311204
Dec. 25, 1986 [JP] Japan ............... 61-311205

[51] Int. Cl.$^4$ ............................... H01J 40/14
[52] U.S. Cl. ............................ 250/578; 357/4; 357/237; 357/30
[58] Field of Search ............ 357/4, 23.7, 30 K; 250/578, 211 J

[56] References Cited

U.S. PATENT DOCUMENTS

| | | | |
|---|---|---|---|
| 3,715,485 | 2/1973 | Weimer | 250/578 |
| 4,352,997 | 10/1982 | Raymond, Jr. et al. | 357/23.7 |
| 4,405,857 | 9/1983 | Hirai et al. | 250/578 |
| 4,459,488 | 7/1984 | Uzawa et al. | 250/578 |
| 4,667,214 | 5/1987 | Sekimura et al. | 357/30 K |
| 4,682,019 | 7/1987 | Nakatsui et al. | 357/30 K |

*Primary Examiner*—David C. Nelms
*Assistant Examiner*—Eric F. Chatmon
*Attorney, Agent, or Firm*—Fitzpatrick, Cella, Harper & Scinto

[57] ABSTRACT

A photoelectric converter comprising a photoelectric conversion unit which includes a pair of main electrodes, spaced by a photoreception area over a semiconductor layer, and an auxiliary electrode. The semiconductor layer and the auxiliary electrode are laminated through the intermediary of an insulating layer in at least the photoreception area. It also includes a storage capacitor for storing electric charges flowing through the photoelectric conversion unit, a transfer transistor for transferring the charges stored in the capacitor, a discharge transistor for discharging the charges stored in the storage capacitor, and dividing device for dividing a switching voltage applied to the control electrode of the discharge transistor to apply a divided voltage to the auxiliary electrode.

33 Claims, 17 Drawing Sheets $T_1$: READING TIME
$T_2$: NON-READING TIME $V_1 < V_2$
$V_1 \leq V_R$

AUXILIARY ELECTRODE BIAS

AUXILIARY ELECTRODE BIAS – OUTPUT CURRENT

CHANGE IN VOLTAGE RELATIVE TO MAIN ELECTRODE FOR READING SIGNAL OR AUXILIARY ELECTRODE

— WITH VOLTAGE DIVIDING CAPACITOR

---- WITHOUT VOLTAGE DIVIDING CAPACITOR $$\frac{V_b}{V_a} = \frac{C_x}{C_{gs}}$$

PHOTOELECTRIC CONVERTER PROVIDED WITH VOLTAGE DIVIDING MEANS

BACKGROUND OF THE INVENTION

1. Field of the Invention

The present invention relates to a photoelectric converter used with a bar code reader, a facsimile apparatus, a digital copier or the like and more particularly to a photoelectric converter of the type having an auxiliary electrode or of the thin film transistor (hereinafter called TFT) type. A gate electrode is provided on a semiconductor layer with an insulating layer interposed therebetween.

2. Related Backgond Art

Recently, as electronic office machines such as facsimiles or digital copying machines become popular, the demand for a small type of inexpensive image input device has increased. Coplanar photoelectric converter (photosensor) which use a-Si, CdS-CdSe or the like as the photoconductors to utilize a photoelectric conversion effect have the advantage that they can directly contact an original document, and requiring no focusing system. Furthermore, they have a short travelling distance of the focusing system. In order to stabilize the sensor characteristics, field effect type photosensors are provided which have an insulating layer and an auxiliary electrode above or below a semiconductor layer among the coplanar type photosensors.

FIGS. 1(a) and (b) are schematics of the photoelectric conversion unit of the photosensor. In FIG. 1(a), an auxiliary electrode and insulating layer are formed on an insulating substrate 1 of glass, ceramic or the like The auxiliary electrode 2 and the insulating layer 3 on which is formed a semiconductor layer 4 are made of CdS.Se, a-Si:H or the like. A pair of main electrodes 6 and 7 are formed on the substrate through the intermediary of a doped semiconductor layer 5 for ohmic contact. A photoreception window 8 is formed between the main electrodes.

The photosensor having a structure shown in FIG. 1(b) has the auxiliary electrode 2 provided over the main electrodes 6 and 7. The substrate 1 is made of a transparent material and receives light from the side of the substrate 1. A part having the same function as the corresponding one of the photosensor of FIG. 1(a) is given the same number.

In the photosensor having the above structure, in order to get a large ratio of the output current to the dark current in response to incident light, an appropriate bias must be applied to the auxiliary electrode 2 in accordance with the kind of majority carriers of a current flowing through the semiconductor layer 4 to operate the photosensor. Namely, a negative bias must be applied when the majority carriers are electrons while a positive bias must be applied when the majority carriers are holes. Such operation will reduce the output current, so that a capacitor which stores the output current must be provided in the circuit which reads the signal from the photosensor. Correspondingly, switching elements such as a TFT which transfers as a signal the electric charges stored in the capacitor and a TFT which discharges the remaining charges after the transfer operation, and a matrix circuit which connects these switching elements are required.

FIG. 2 is a schematic equivalent circuit diagram of a plurality of line-sensor type photoelectric conversion elements disposed in an array. In FIG. 2, reference characters Rs1, Rs2, . . . Rsn denote photosensors having an auxiliary electrode; Cs1, Cs2 . . . Csn storage capacitors; Tt1, Tt2 ... Ttn TFTs which transfer electric charges stored in the capacitors Cs1-Csn; Tr1, Tr2 . . . Trn discharge TFTx which discharge electric charges remaining in the capacitors Cs1-Csn after the transfer operation. Reference characters Lg1-Lgn denote leads connected to the control electrodes or gates of the transfer TFTs Tt1-Ttn and the control electrodes or gates of the discharge TFTs Tr1-Trn. Reference characters Vg1-Vgn denote switching voltages applied to the corresponding leads Lg1-Lgn. Reference character LD denotes a lead connected to the main electrodes of the photosensors Rs1-Rsn. Reference character VD denotes a voltage applied to LD. Reference character LR denotes a lead connected to the storage capacitors Cs1-Csn. Reference character VR denotes reference voltage for storage capacitors Cs1-Csn. If the storage capacitors Cs1-Csn are discharged via discharge TFTs Tr1-Trn, the voltages across the capacitors Cs1-Csn will become VR.

In the photosensor, if a steady state bias is applied to the auxiliary electrode in accordance with the kind of majority carriers in the photosensor, namely, if a negative bias is applied when the majority carriers are electrons and if a positive bias is applied when the majority carriers are holes, the minority carriers will collect in the vicinity of the auxiliary electrode in the semiconductor layer and the majority carriers will collect in that portion of the semiconductor layer opposite the auxiliary electrode. In such condition, the majority and minority carriers are not re-combined smoothly, so that even if irradiation light to the photosensor may be cut off, the remaining photocurrent will flow as long as the minority carriers continue to exist. As a result, the optical response speed and hence the S/N ratio of the photosensor are lowered.

In an attempt to cope with this, for example, as shown in FIG. 3, if a bias voltage V1 of a predetermined level, negative when the majority carriers are electrons and positive when the majority carriers are holes, is applied in advance to the auxiliary electrode when the photosensor is to be read and if a pulse voltage of V2 opposite in polarity to the bias voltage is applied to the auxiliary electrode during a non-reading interval provided immediately before reading, a rise in the optical response would be improved to provide a large ratio of the output current to the dark current in response to incident light.

However, if such operation is tried on, for example, an image reading apparatus including a multiplicity of one-dimensionally arranged such photosensors, the respective sensor bits are read in a time series, so that the timings of applying the respective pulse voltages are shifted bit by bit. Thus, if voltages applied to the auxiliary electrodes of the photosensors are controlled in a circuit separated from the circuit in which the gate voltages of the transfer and discharge TFTs are controlled, a matrix circuit for control of the auxiliary electrodes of the photosensors and a matrix circuit for control of gate electrodes of the transfer TFTs would be required. Thus the entire circuit would become complicated. In addition, the timings of applying pulses, pulse widths, pulse magnitudes, etc., must be determined individually, so that the driving would become complicated.

Next, an example of the structure of a photoelectric conversion section of a photosensor of TFT type is shown in FIGS. 4 and 5. FIG. 4 is a plan view of the photoelectric conversion section, and FIG. 5 is a cross section taken along line X—X' of FIG. 4. In the Figures, the photoelectric conversion section comprises a substrate 401 made of glass for example, a gate electrode 402, an insulating layer 403, a photoconductive semiconductor layer 404, source and drain electrodes 406 and 407, an n+ layer for ohmic contact between the semiconductor layer 404 and the source and drain electrodes 406 and 407.

Dark current of a TFT type photosensor can be controlled by applying a bias voltage to the gate electrode to suppress the effect of the surface of the insulating layer. Thus, a favorable light quantity dependence characteristic (hereinafter called λ) of a photoelectric conversion output is obtained which is as near as 1. The reproductiveness is also satisfactory with little manufacture deviation within a lot and among lots.

These characteristics lead to advantageous effect under static (DC) drive conditions. However, under dynamic drive conditions commonly employed for image sensors or the like, i.e., under a charge storage mode, there may arise a problem which is described hereinafter.

FIG. 6 is a circuit diagram of a readout circuit using a TFT type photosensor under a charge storage mode. Connected to a drain electrode is a sensor power supply $V_S$ and to a gate electrode a bias power supply $V_B$. Connected to a source electrode is a storage capacitor C. The charge stored in the storage capacitor is discharged to a load resistor $R_L$ upon activation of a transfer switch SW.

Operating waveforms of the circuit are shown in FIG. 7. The transfer switch SW repeatedly turned on and off at the period of a storage time $T_S$. Namely, while the transfer switch SW. is being turned off, photocurrent $i_S$ of the photosensor is charged in the storage capacitor. Whereas while the transfer switch SW is made turned on, the charge stored in the storage capacitor C is caused to be discharged to the load resistor $R_L$ which in turn is read as an output of the photosensor.

Voltage $V_C$ appearing across the storage capacitor C can be represented in terms of an integrated value of $i_S$ under the condition of $V_S \gg V_C : V_C = \int_0^t i_S dt = i_S xt$. Thus, the voltage $V_C$ increases substantially linearly with respect to time t. This increase in voltage is shown by a broken line in FIG. 7.

However, in practice, when the photosensor in the circuit of FIG. 6 is driven a distored waveform of the voltage $V_C$ as shown by a solid line in FIG. 7 is obtained. The reason for this is that the voltage $V_C$ quickly changes to zero when the transfer switch turns on and a gate bias voltage $\Delta V_{gs}$ is made relatively small so that transient current $i_a$ (hatched portion in FIG. 7) flows through the source and drain. This transient current adversely effects the light dependence characteristic of an output from a photoelectric converter constructed of the above circuit, to thereby lower the gamma λ value to 0.4 to 0.5 as shown in FIG. 8, which is considerably small as compared to the gamma λ value 1 calculated based on the static drive conditions, and thereby deteriorates an S/N ratio.

SUMMARY OF THE INVENTION

It is therefore an object of this invention to provide a photosensor apparatus which provides an improved optical response speed and has a simple structure.

It is another object of the present invention to provide a photoelectric converter capable of eliminating the above-mentioned problem associated with a dynamic operation and positively utilizing the characteristic performance of a TFT type photosensor.

It is a further object of the present invention to propose a drive circuit which can be easily fabricated on a same substrate as that of a photosensor and provide a photoelectric converter of low cost and high yield by positively utilizing the characteristic performance of a TFT type photosensor having a high S/N ratio and low manufacture deviation.

It is another object of the present invention to provide a photoelectric converter of the type that the photoelectric conversion section is constructed of a photoconductive layer, first and second electrodes formed on a same plane and facing to the photoconductive layer, and a third electrode formed on the photoconductive layer with an insulating layer interposed therebetween and that a supply voltage is applied to the first electrode to obtain a photoelectric conversion output from the second electrode, wherein the second electrode is connected commonly to the third electrode.

It is a further object of the present invention to provide a photoelectric converter of the type that the photoelectric conversion section is constructed of a photoconductive layer, first and second electrodes facing to the photoconductive layer, and a third electrode formed on the photoconductive layer with an insulating layer interposed therebetween and that a supply voltage is applied to the first electrode to obtain a photoelectric conversion output from the second electrode, wherein a capacitor is formed between the second electrode and the third electrode.

It is a still further object of the present invention to provide a photoelectric converter which comprises a photoelectric conversion section constructed of a photoconductive layer, first and second electrodes facing to the photoconductive layer, and a third electrode formed on the photoconductive layer with an insulating layer interposed therebetween; a capacitor formed between the second and third electrodes; a storage capacitor electrically connected to the second electrode; first switch means electrically connected to the second electrode for discharging the storage capacitor; gate bias switch means electrically connected to the third electrode and actuated in cooperation with first switch means; and second switch means electrically connected to the second electrode for charge transfer.

It is another object of this invention to provide a photoelectric converter comprising a photoelectric conversion unit which includes a pair of main electrodes, spaced by a photoreception area over a semiconductor layer, and an auxiliary electrode laminated with the semiconductor layer through the intermediary of an insulating layer in at least the photoreception area, a storage capacitor for storing electric charges flowing through the photoelectric conversion unit, a transfer transistor for transferring the charges stored in the capacitor, and a discharge transistor for discharging the charges stored in the storage capacitor, and dividing means for dividing a switching voltage applied to the control electrode of the discharge transistor to apply a divided voltage to the auxiliary electrode.

DETAILED DESCRIPTION OF THE PREFERRED EMBODIMENTS

Now an embodiment of this invention will now be described in detail with reference to the drawings.

Embodiment 1

Figure 1:
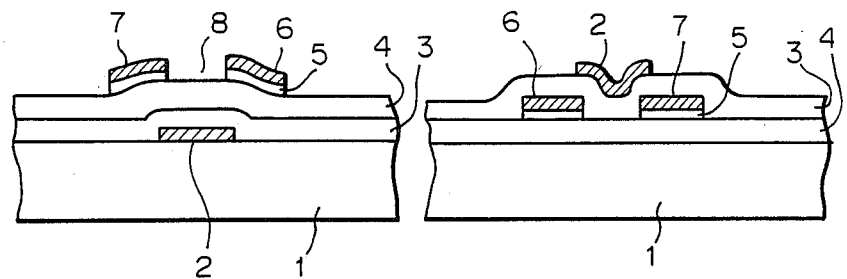
FIGS. 1(a) and 1(b) are schematic diagrams showing the structure of a photoelectric conversion section of a photoelectric converter.
Figure 2:
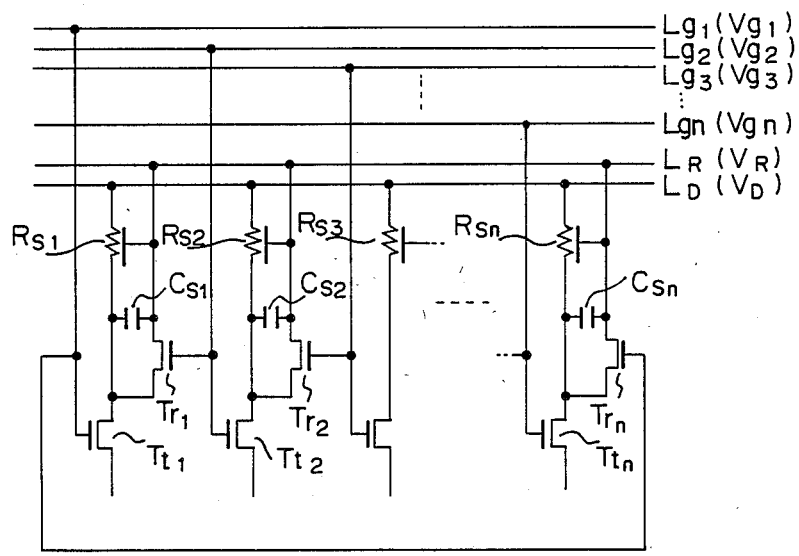
FIG. 2 is a circuit diagram of the photoelectric converter.
Figure 3:
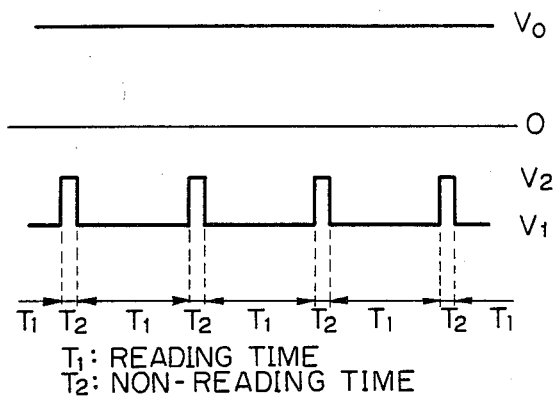
FIG. 3 shows voltage waveforms applied to the auxiliary electrode of the photoelectric converter.
Figure 4:
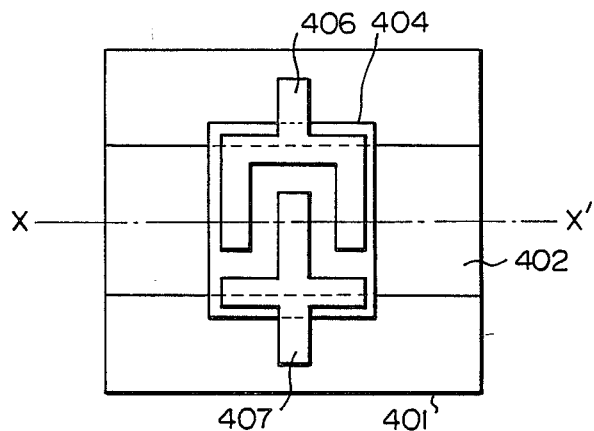
FIG. 4 is an enlarged view of the photosensor section (photoelectric conversion section) of a conventional photoelectric converter.
Figure 9:
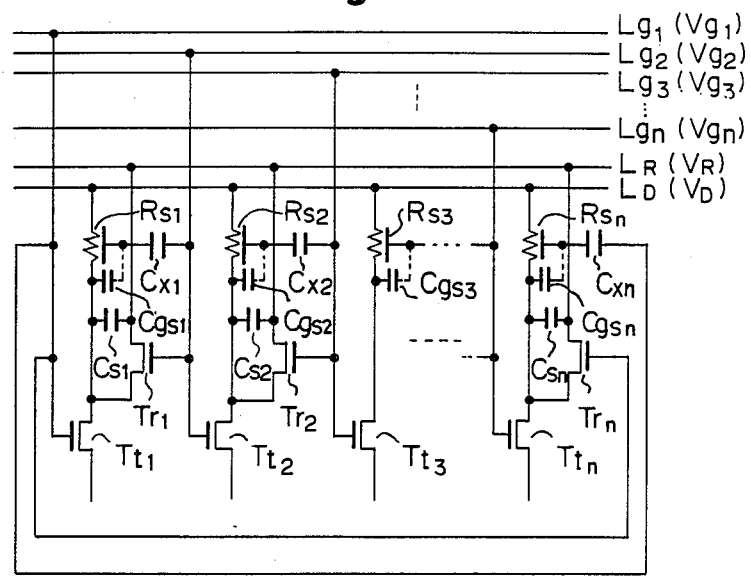
FIG. 9 is a circuit diagram of one embodiment of a photoelectric conversion apparatus according to this invention.
Figure 10:
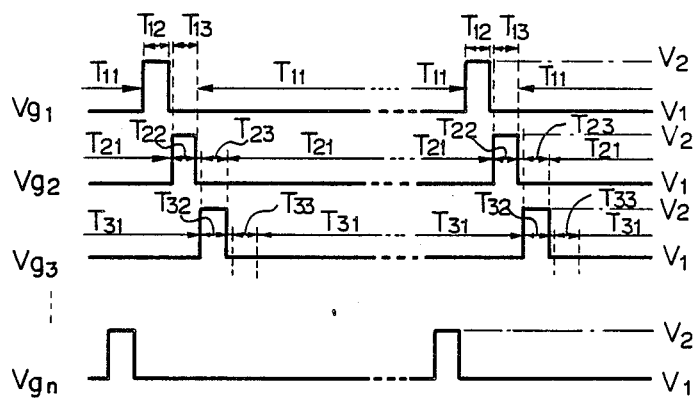
FIG. 10 is a timing chart for explaining the operation of the apparatus.

FIG. 9 is a circuit diagram of one embodiment of a photoelectric conversion apparatus according to this invention. FIG. 10 is a timing chart for explaining the operation of the apparatus. In FIG. 9, as in FIG. 2, reference characters Rs1, Rs2 . . . Rsn denote photosensors (photoelectric conversion units) having an auxiliary electrode; Cs1, Cs2 ... Csn storage capacitors; Tt1, Tt2, Ttn transfer TFTs for transferring the charges stored in the capacitors Cs1-Csn; Tr1, Tr2 . . . Trn discharge TFTs for discharging the charges remaining in the capacitors Cs1-Csn after the transfer operation; and Cx1, Cx2 . . . Cxn dividing capacitors for applying divided voltages to the auxiliary electrodes of photosensors Rs1-Rsn. Reference characters Cgs1, Cgs2, . . . Cgsn denotes capacitances fromed between the auxiliary electrodes and the corresponding main electrodes on the connection side of the storage capacitors in the photosensors Rs1-Rsn. Reference characters Lg1-Lgn denote leads connected to the control electrodes or gates of the transfer TFTs Tt1-Ttn and the control electrodes or gates of the discharge TFTs Tr1-Trn, and the dividing capacitors Cx1-Cxn. Reference characters Vg1-Vgn denote switching voltages applied to the corresponding leads. Reference character LD denotes a lead connected to the main electrodes of the photosensors Rs1-Rs2, and VD a voltage applied to that lead. Reference character LR denotes a lead connected to the storage capacitors Cs1-Csn, and VR a reference voltage for the storage capacitors Cs1-Csn. When the storage capacitors Cs1-Csn are discharged via the discharge TFTs Tr1-Trn, the voltages across the storage capacitors Cs1-Csn all become VR. The leads Lg1-Lgn, LD, and LR constitute a matrix circuit.

The operation of the photoelectric conversion apparatus will now be described. Assume that the majority carriers in the photosensors are electrons.

In FIG. 9, if positive and negative voltages VD and VR are applied to the leads LD and LR, respectively, currents will flow through the photosensors Rs1-Rsn in accordance with a quantity of irradiated light, so that electric charges are stored in the storage capacitors Cs1-Csn to raise the main electrode side potentials of the storage capacitors Cs1-Csn in the photosensors Rs1-Rsn.

If switching voltage Vgi-Vgn are applied at the timing shown in FIG. 10, to the gates of the transfer and discharge TFTs Tt1-Ttn and Tr1-Trn via the matrix circuit constituted by the respective leads in FIG. 9, electric charges will be stored in the storage capacitors Cs1-Csn during the time interval T11, and the transfer TFT Tt1 will be turned on during the time interval T12 to thereby cause the electric charges in the storage capacitor Cs1 to be transferred as a signal. The discharge TFT Tr1 is turned on during the time interval T13 to thereby cause the storage capacitor Cs1 which has completed the transfer operation to be short-circuited to thereby discharge the remaining charges. Thus one cycle of reading the photosensor Rs1 is completed. At the same time, the transfer TFT Tt2 is turned on and the charges which are being stored in the storage capacitor Cs2 are transferred as a signal during the time duration T21. A reading cycle similar to that effected in the photosensor Rs1 is effected successively in the subsequent photosensor bits.

Figure 11:
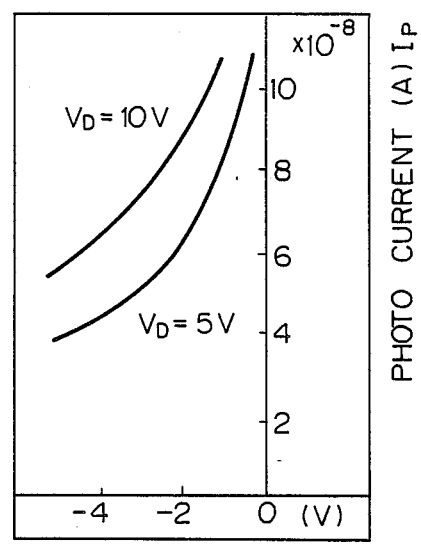
FIGS. 11 and 12 are characteristic diagrams for explaining the effect of the apparatus.
Figure 12:
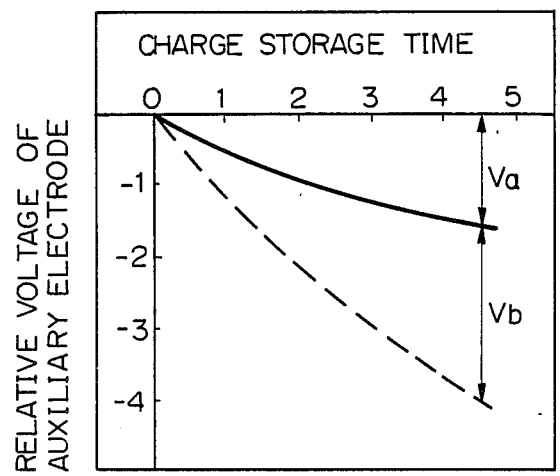

In the circuit shown in FIG. 9, reading, transfer and discharge are performed as described above, and, simultaneously, a voltage in phase with the switching voltage applied to the gates of the discharge TFTs Tr1-Trn is applied to the auxiliary electrodes of the photosensors Rs1-Rsn to improve their optical response speed. In more detail, the photosensor Rs1 is especially considered as an example. A divided voltage between the switching voltage Vg2, applied to the discharge TFT Tr1, and the reference voltage VR obtained by the dividing operation of the dividing capacitor Cx1, the capacitance Cgs1 formed between the auxiliary electrode and the main electrode (on the side of the storage capacitor Cs1) of the photosensor Rs1, and the storage capacitor Cs1 is applied to the auxiliary electrode of Rs1. In the photosensor Rs1, electrons are drawn in by a pulse voltage applied during the discharge interval T13 during which a large current flows, the re-combination of holes is expedited at the same time, the optical information remaining in the photosensor Rs1 before the discharge interval is cancelled, and especially improves a fall in the optical response during the reading duration T11 to thereby provide a large ratio of the output current to the dark current in response to incident light. On the other hand, while a large current flows through the photosensor Rs1 during the discharge duration T13, electric charges are not stored in the storage capacitor Cs1 because the storage capacitor Cs1 is in its discharge state, so that there is no probability that unnecessary information is mixed. Further, in the charge storage type reading circuit, the potential of the auxiliary electrode of the photosensor changes relative to that of the main electrode on the signal reading side as electric charges are stored in the storage capacitor, so that as shown in FIG. 11, the output current changes. In contrast, in the circuit of this invention, fluctuations in the relative potential of the auxilary electrode are suppressed to within the ratio in capacitance valued of Cgs1 to Cx1 due to the above dividing effect, so that fluctuations in the output current are suppressed to thereby provide stabilized driving of the apparatus as shown in FIG. 12.

Figure 13:
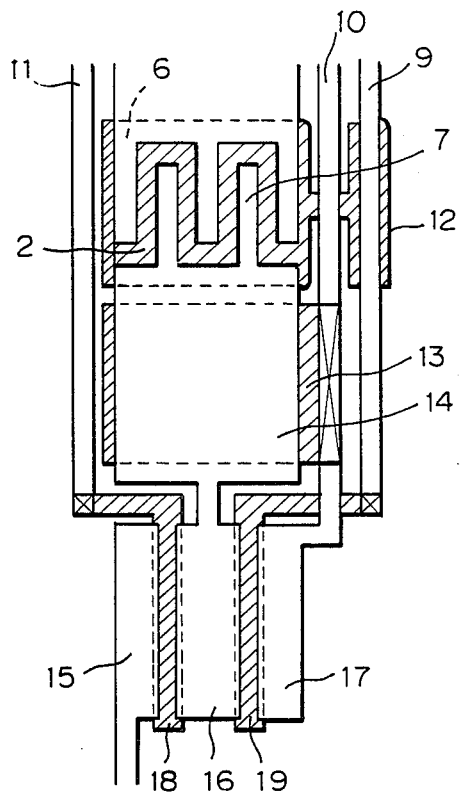
FIG. 13 is a schematic view of the apparatus.
Figure 14:
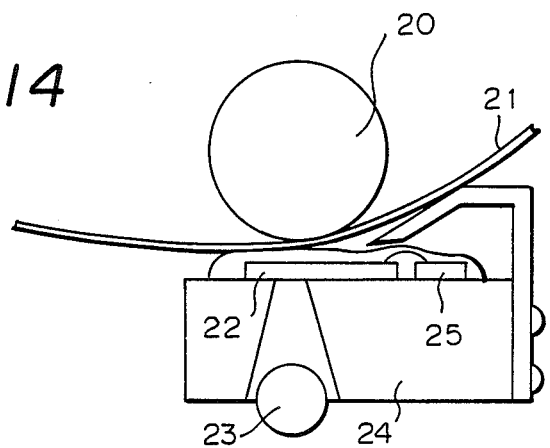
FIG. 14 is a schematic view of an image reading device using the photoelectric conversion apparatus.

An image reading device using the above circuit structure will now be described. FIG. 13 is a schematic view of the photosensor device. Like reference characters are used to denote like parts in FIGS. 13 and 9. FIG. 14 is a schematic view of the image reading device using the photosensor device. In FIG. 13, photosensor Rs1 is constituted by an amorphous silicon hydride semiconductor layer 4 (not shown in FIG. 13) as the photoconductive layer, insulating layer 3 (also not shown in FIG. 13), main electrodes 6 and 7, and auxiliary electrode 2. A lead 9 comprising lead Lg2, insulating layer 3 and electrode 12 constitute dividing capacitor Cx1. Electrodes 13 and 14 and insulating layer 3 consitute the storage capacitor Cs1. Semiconductor layer 4, insulating layer 3 and electrodes 16 and 17 and 19 constitute discharge TFT Tr1. The semiconductor layer 4, insulating layer 3 and electrodes 15, 16 and 18 constitute transfer TFT Tt1. These elements are formed on a transparent insulating substrate.

The photosensor device is provided in the image reading device, as shown in FIG. 14, for example. Shown in FIG. 14, an incident, light window is provided in a mount 24 so that the photosensor device is irradiated with light from a light source 23 through the window. Provided on the mount 24 are the photosensor device 22 and an IC 25 which processes the optical signal from the photosensor device 22. An original document 21 fed by a paper feed roller 20 is irradiated with the light passing through the window and photosensor device 22. The light reflected from the document is sensed by a photosensor of the photosensor device 22. The image reading device having the above structure is able to read the document at high speed to provide an image of high quality.

Embodiment 2

Figure 15:
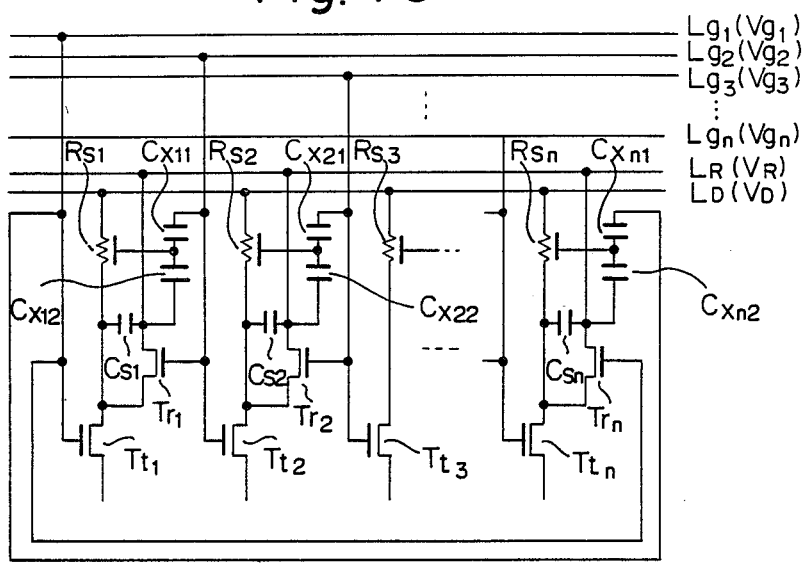
FIGS. 15 and 16 are circuit diagram of other embodiments of the apparatus.
Figure 16:
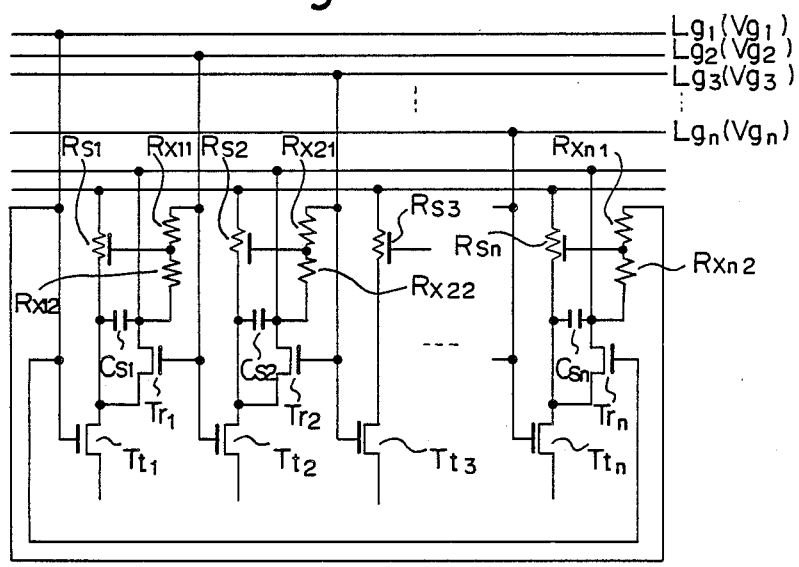

FIGS. 15 and 16 are circuit diagrams showing other embodiments of the photosensor device according to this invention. Like reference characters are used to denote like parts in FIGS. 9, 15 and 16 and further description of those parts and the operation thereof will be omitted. In FIG. 15, the first bit is especially considered as an example as in the previous embodiment. A voltage obtained by dividing the switching voltage Vg2, applied to the discharge TFT Tr1, by dividing capacitors Cx11 and Cx12 with the VR as the reference voltage is applied to the auxiliary electrode of the photosensor Rs1. A pulse voltage is applied to the auxilairy electrode immediately before the reading interval as in the previous embodiment to especially improve a fall in the optical response speed of the photosensor Rs1 to thereby provide a large ratio of the output current to the dark current in response to incident light. Since in this embodiment the potential of the auxiliary electrode is fixed during the reading interval. however, fluctuations in the relative potential of the signal outputting side one of the main electrodes cannot be compensated. While in the particular embodiment the switching voltage Vg2 of the discharge TFT Tr1 is divided by the capacitors to be applied to the auxiliary electrode of photosensor Rs1, the dividing manner is not limited to the capacitor division. Alternatively, for example, as shown in FIG. 16, resistance division which uses dividing resistors Rx11 and Rx12 may be used. When these embodiments are applied to the image reading device of FIG. 14 as in the previous embodiment, high quality image reading is performed at high-speed.

As described above in detail, in the photosensor device of the above embodiment, a fall in the optical response speed of the photosensor is greatly improved and a high ratio of the output current to be dark current in response to incident light is provided.

By forming the dividing means with the storage capacitor, the capacitance between the auxiliary electrode and the storage capacitor connection side one of the main electrodes of the photosensor, and the dividing capacitor connected between the control electrode of the discharge transistor and the auxilairy electrode, or by forming the dividing means with series connected capacitors or series connected resistors connected across the control electrode of the discharge transistor and the storage capacitor, fluctuations in the potential of the auxiliary electrode, occurring when electric charges are stored in the storage capacitor, relative to that of the main electrode from which the signal of the photosensor is taken are reduced and hence fluctuations in the output current are suppressed to within a small limit.

The image reading device using the photosensor device according to this invention is able to read a document at high speed with high quality.

Embodiment 3

Figure 17:
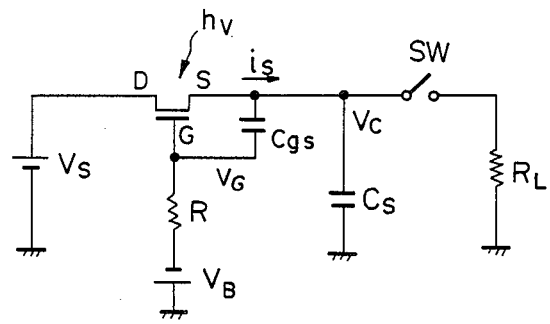
FIG. 17 is an equivalent circuit of a third embodiment of the photoelectric converter according to the present invention.

An equivalent circuit of a third embodiment of the photoelectric converter according to the present invention is shown in FIG. 17.

A sensor electrode $V_S$ is connected to a drain electrode D, while a gate bias electrode $V_B$ is connected to a gate electrode G via a resistor R. A bias capacitor Cgs is connected between the gate electrode G and a source electorde S. Connected to the source electrode S are a transfer switch SW and a load resistor $R_L$.

The operation of the photoelectric converter constructed as shown in FIG. 17 will be described.

The gate bias power supply $V_B$ charges the bias capacitor Cgs through the resistor R to thereby make the gate electrode potential at $V_B$. When the transfer switch SW turns off from its on-state, photocurrent $i_S$ starts charging a storage capacitor $C_S$. As the storage capacitor $C_S$ is charged, the potential $V_C$ thereof rises. Assuming that the time constant R x Cgs >> $T_S$ (which is an ON/OFF period of the transfer switch), the gate voltage $V_G$ follows the potential $V_C$ of the storage capacitor $C_S$.

Namely, the gate-source voltage $\Delta V_{GS} = V_G - V_C$ becomes constant which is maintained nearly constant irrespective of the ON/OFF operation of the transfer switch. Thus, transient current as described with the conventional problem does not flow.

Figure 18:
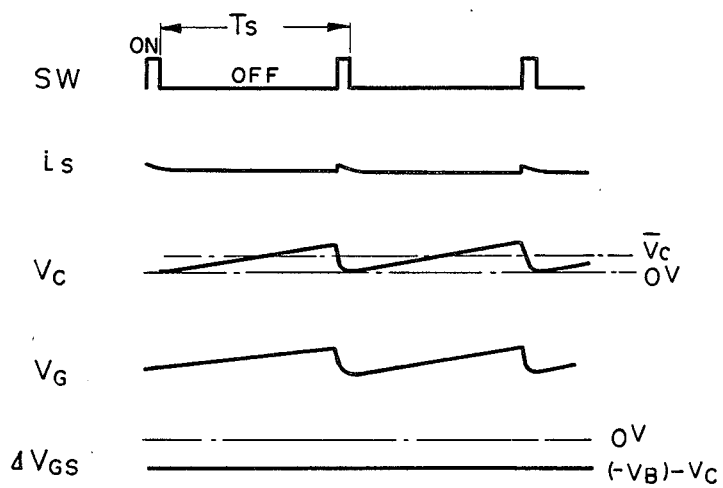
FIG. 18 is a timing chart for illustrating the operation of the third embodiment.

FIG. 18 shows waveforms at various circuit points of the photoelectric converter.

An effective $\Delta V_{GS}$ becomes equal to $(-V_B) - \overline{V}_C$ during operation wherein $\overline{V}_C$ is a mean value of $V_C$. $\Delta V_{GS}$ varies with $\overline{V}_C$ but it does not change transiently so that there occurs no problem.

Embodiment 4

Figure 19:
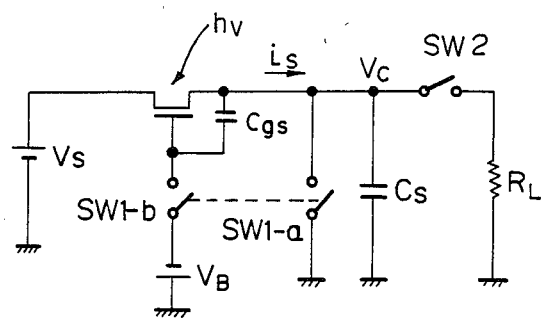
FIG. 19 is an equivalent circuit of a fourth embodiment of the photoelectric converter according to the present invention.

A fourth embodiment of the present invention is shown in FIG. 19.

In the circuit shown in FIG. 19, in addition to a transfer switch sw2, a reset switch sw1-a is provided which serves to discharge the residual charge after charge transfer in a storage capacitor $C_S$. Connected to the gate electrode of a photoelectric conversion section is a gate bias switch sw1-b which is activated in cooperation with the switch sw1-a.

Figure 20:
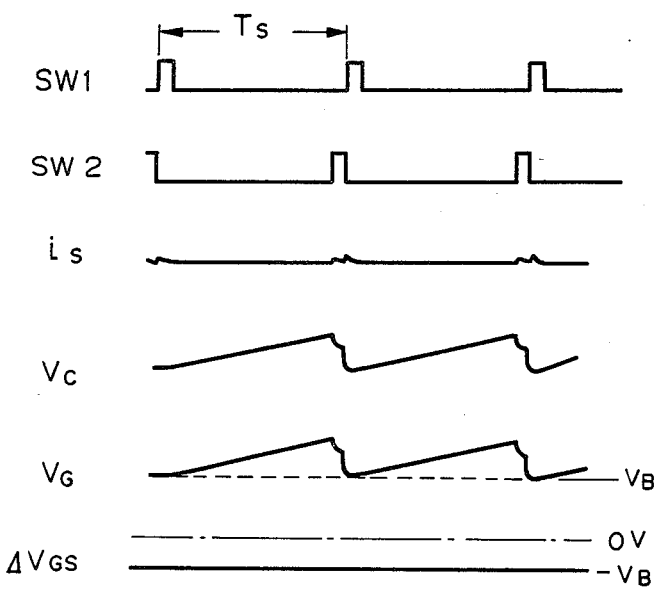
FIG. 20 is a timing chart for illustrating the operation of the fourth embodiment.

The operating timings are shown in FIG. 20.

When the switches sw1-a and sw1-b are turned on, the charge in the storage capacitor $C_S$ is discharged to thereby cause $V_C$ to become equal to 0. At the same time, the bias capacitor Cgs is charged to $V_B$. When the switches are turned off, photocurrent produced at the photoelectric conversion section charges the storage capacitor $C_S$. As it is charged, the potential $V_C$ of the storage capacitor $V_C$ rises. On the other hand, since the switch sw1-b is maintained turned off, there is no current path for the bias capacitor Cgs.

As a result, the potential $V_G$ at the gate electrode G operates to follow the potential $V_C$ of the storage capacitor $C_S$ while maintaining $\Delta V_{GS}$ constant.

The transfer switch sw2 becomes turned on after a storage time $T_S$. At this time, the charge voltage $V_C$ of the storage capacitor $C_S$ is discharged via the load resistor $R_L$. In the circuit shown in FIG. 19, however, since the storage capacitor $C_S$ is discharged via the discharge switch sw1-a, it is not necessary to completely effect the discharge through the load resistor $R_L$. In other words, there occurs no problem even if the voltage $V_C$ across the storage capacitor $C_S$ directly read out is used. In this embodiment, the potential Vgs between the gate electrode G and the source electrode S is maintained constant $(-V_B)$. Therefore, it is possible to set the gate-source bias of the photoelectric conversion section at an optimum value under any conditions of incident light quantity, storage time and so on. Further, transient current to be caused by a change in the potential $\Delta$Vgs will not be produced. Furthermore, the effect of the surface of the insulating layer is suppressed to large extent.

Figure 21:
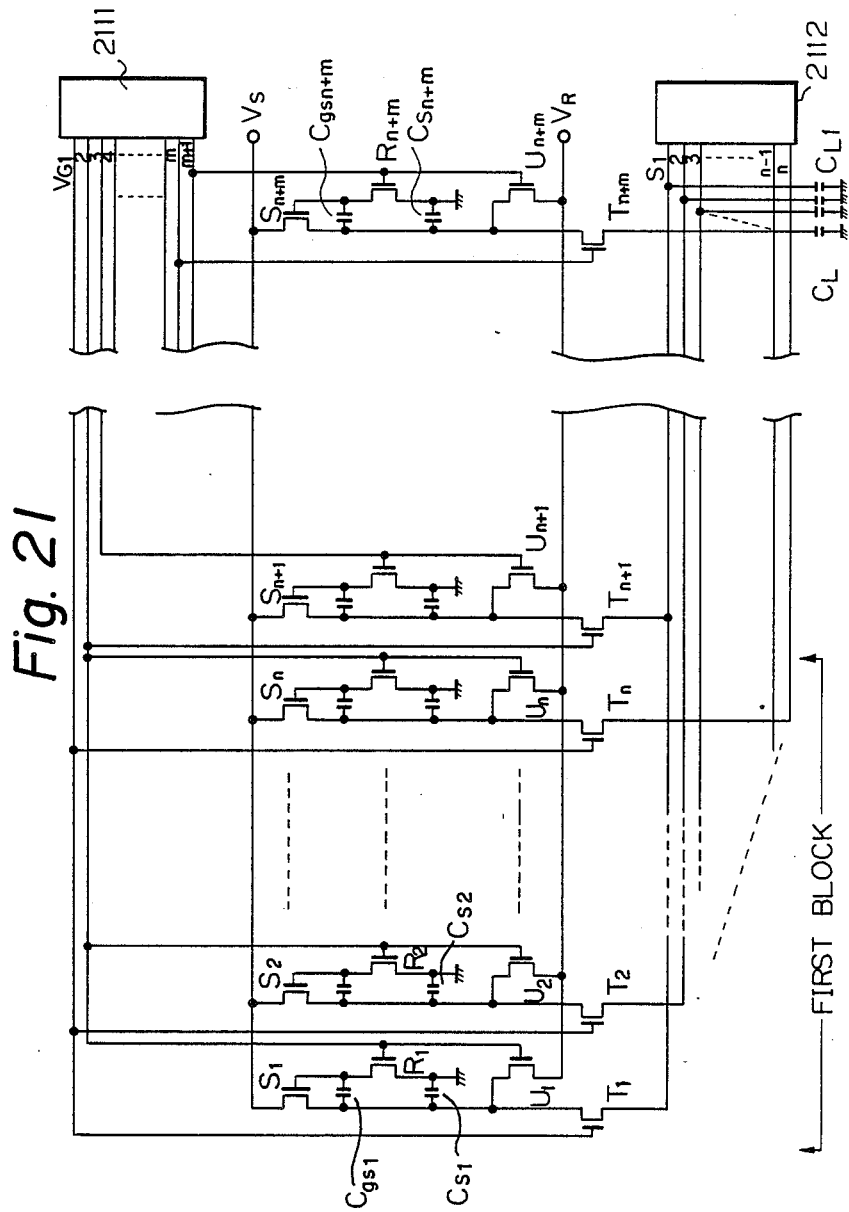
FIG. 21 is an equivalent circuit showing a part of a line sensor type photoelectric converter according to the present invention.

FIG. 21 is an equivalent circuit of a line sensor type photoelectric converter composed of n x m photoelectric converters of FIG. 19 disposed in array.

In the Figure, S1 to Sn+m denote TFT type photoelectric conversion sections, Cgs1 to Cgsn+m denote gate bias capacitors, R1 to Rn+m denote gate bias TFTs, Cs1 to Csn+m denote storage capacitors, U1 to Un+m denote reset TFTs, and T1 to Tn+m denote transfer TFTs.

The line sensor type photoelectric converter is divided into m blocks each having n elements, m block being matrix connected to m +1 gate lines and n signal lines. In the Figure, reference numeral 2111 represents a driver section for sequentially applying voltage to gate lines $V_{G1}$ to $V_{Gm+1}$, 2121 a signal processing section for picking up signal voltage on signal lines S1 to Sn. $V_S$ denotes a sensor bias, $V_R$ denotes a reset voltage for the storage capacitor.

In the photoelectric converter, the gate electrodes of a reset TFT U and a gate bias TFT R are connected in common to the gate electrode of a next block transfer TFT T. Simultaneously when a next block signal is transferred upon shifting of voltage pulses at the driver section 2111, the preceding block is reset.

The circuit shown in FIG. 21 can be fabricated in a same substrate. More particularly, by using as the photoconductive semiconductor material an a-Si:H film (amorphous silicon hydride film) formed by glow discharge, the TFT photoelectric conversion section, storage and bias capacitors, transfer, reset and bias TFTs, wiring leads and so on can be realized by simultaneous processes using a laminated structure of a lower electrode, an SiNH insulating layer, an a-Si:H layer, an n+ layer, and an upper electrode. The photoelectric converter of this invention is suitable for application to a line sensor type photoelectric converter made through simultaneous processes on a same substrate.

An example of patterning a line sensor type photoelectric converter made through simultaneous processes of the above type will be described.

Figure 22:
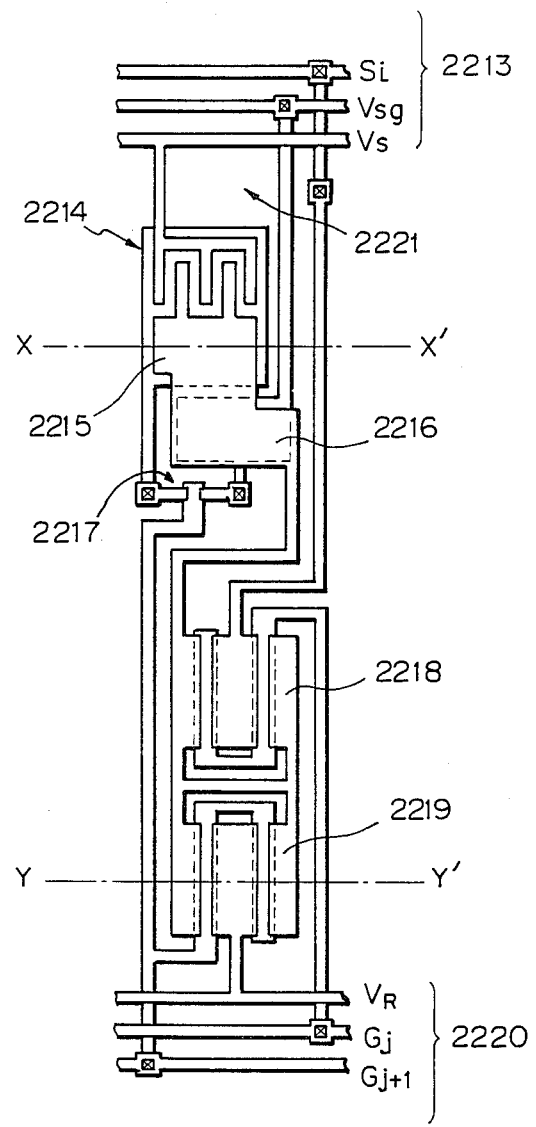
FIG. 22 is a plan view showing the patterning of the line sensor type photoelectric converter.

FIG. 22 shows a patterning of one bit of the circuit shown in FIG. 21, wherein only the upper and lower wiring leads and contact hole portions are shown in order not to make the drawing complicated. In the Figure, 2213 represents a signal matrix section, 2214 a photoelectric conversion section, 2215 a gate bias capacitor, 2216 a storage capacitor, 2217 a gate bias TFT, 2218 a transfer TFT, 2219 a reset TFT and 2220 a gate drive wiring section. In this example, a so-called lensless structure is employed wherein an original is read by directly contacting it on a sensor section without using a focusing lens. Therefore, a window 2221 for applying light on an original is provided, and in addition the lower electrode of the photoelectric conversion section is made of transparent material which electrode serves also as a light shielding film. The transfer and reset TFTs are disposed in mirror symmetrical relation to each other. The reason for this is that in case the alignment for the upper and lower electrodes is displaced in the longitudinal direction of the substrate, the gate-source capacitance of a pair of TFTs is compensated and maintained unchanged.

A changed in gate-source capacitance in the longitudinal direction results in the offset components of a signal output. With the above-described patterning, however, it is possible to remove the offset components. The load capacitor $C_{Li}$ (i=1 to n) in the equivalent circuit of FIG. 21 is not shown in FIG. 22. The value of the load capacitor is set at a value ten to several hundred times as large as the stray capacitance between signal lines S1 to Sn present at an signal matrix section 2213. It is also possible to directly read a signal output in the form of current without using the load capacitor.

Figure 23:
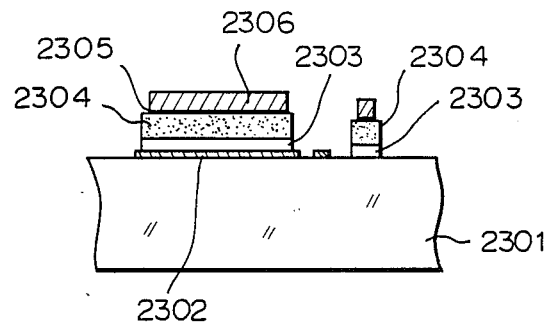
FIG. 23 is a cross section taken along line X—X' of FIG. 22.
Figure 24:
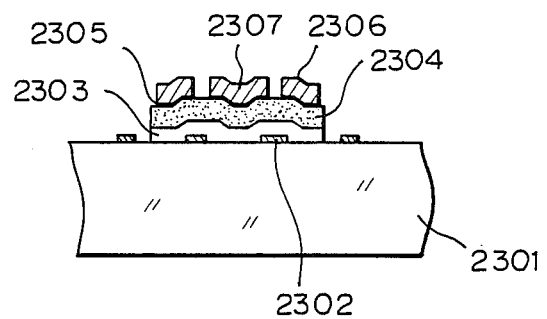
FIG. 24 is a cross section taken along line Y—Y' of FIG. 22.

FIG. 23 is a cross section taken along line X—X'of FIG. 22, and FIG. 24 is a cross section taken alone line Y—Y' of FIG. 22. In the Figures, 2301 represents a substrate made of glass for example, 2302 represents a lower electrode which corresponds to a lower electrode of a capacitor in FIG. 23 and a gate electrode of a TFT in FIG. 24. An insulating film 2320 is made of $SiN_xH$, $SiO_2$ or the like. A photoconductive semiconductor layer 2304 is made of a-Si:H or the like. An n+ layer 2305 is used for ohmic contact with the upper electrode. 2306 and 2307 represent upper electrodes which correspond to an upper electrode of a capacitor in FIG. 23 and source and drain electrodes of a TFT in FIG. 24.

According to the embodiments 3 and 4 described so far, a capacitor is formed between the gate and source electrodes of a TFT serving as the photoelectric conversion section so that the potential between gate and source electrodes can be always maintained constant. As a result, various advantageous effects can be obtained some of which are:

(1) Transient current does not flow during a storage operation. Thus, the gamma λ value becomes near 1 and a same S/N ratio as with a static operation can be obtained.
(2) Since a stable negative bias can be applied between the gate and source of a photosensor, the effect of the surface of the insulating layer on the side of the photosensor can be eliminated, to thereby realize a photoelectric converter with little manufacture deviation among lots and good reproductiveness and productivity.
(3) A TFT photosensor, gate bias TFT, transfer and reset TFTs, storage capacitor and the like can be fabricated using simultaneous processes on a same substrate, to thereby realize a line sensor type photoelectric converter having a high performance and of low cost.

The above-mentioned first and second electrodes are preferably formed on a same plane on the photoconductive layer.

Further, the bias voltage is applied to the third electrode via a resistor or a switch.

Embodiment 5

Figure 5:
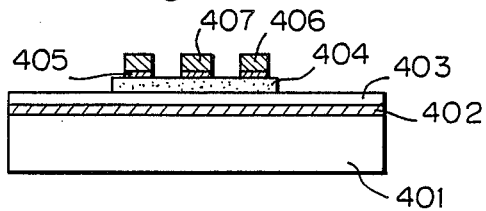
FIG. 5 is a cross section taken along line X—X' of FIG. 4.
Figure 6:
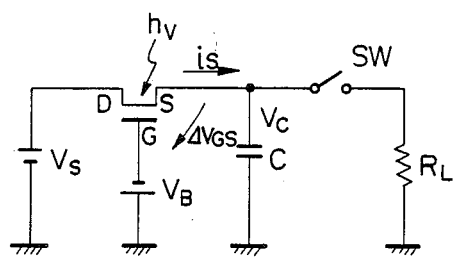
FIG. 6 is an equivalent circuit of a conventional photoelectric converter.
Figure 7:
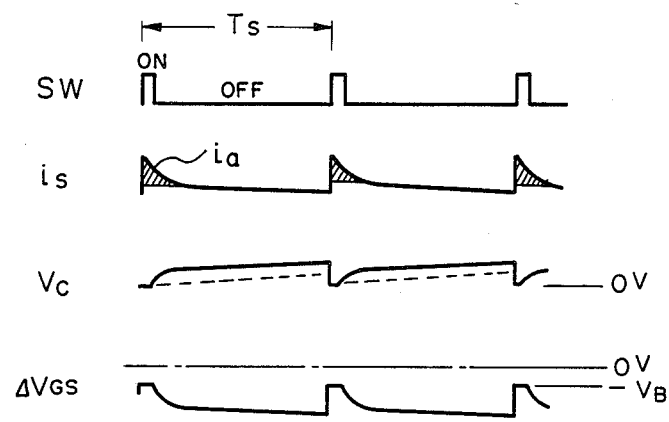
FIG. 7 is a timing chart for the operation of the conventional photoelectric converter.
Figure 8:
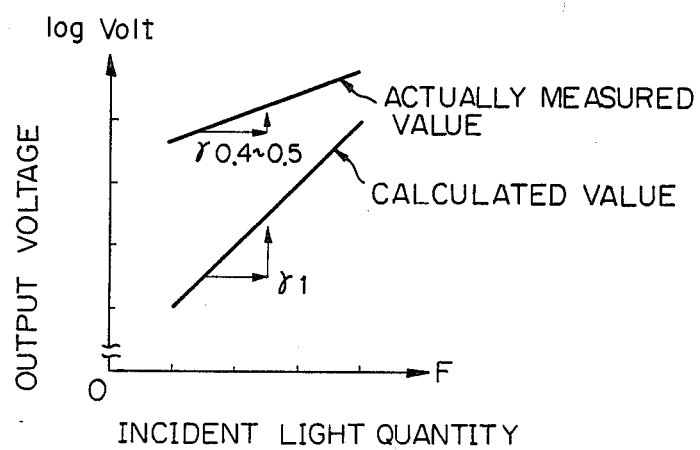
FIG. 8 shows the light dependence characteristic of an output voltage of the conventional photoelectric converter.

An equivalent circuit of a fifth embodiment of the photoelectric converter according to the present invention is shown in FIG. 5.

A sensor power supply $V_S$ is connected to a drain electrode D, and a gate electrode is connected in common to a source electrode S. Connected also to the source electrode A are a storage capacitor C and a load resistor $R_L$ via a transfer switch SW.

Figure 25:
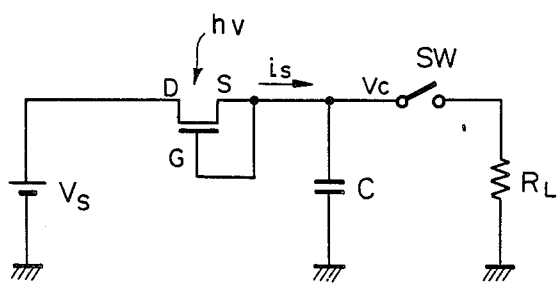
FIG. 25 is an equivalent circuit of a fifth embodiment of the photoelectric converter photosensor according to the present invention.

Next, the operation of the photoelectric converter whose equivalent circuit is shown in FIG. 25 will be described.

When the transfer switch turns off from its on-state, photocurrent $i_S$ flows into the storage capacitor C to start a charge operation. As the charge operation is performed, the voltage $V_C$ of the storage capacitor C rises.

On the other hand, since the gate and source electrodes are connected together, the gate-source voltage $V_{GS}$ is always maintained at 0 potential. Therefore, transient photocurrent described before to be caused while the transfer switch SW is turned on does not flow.

Embodiment 6

Figure 26:
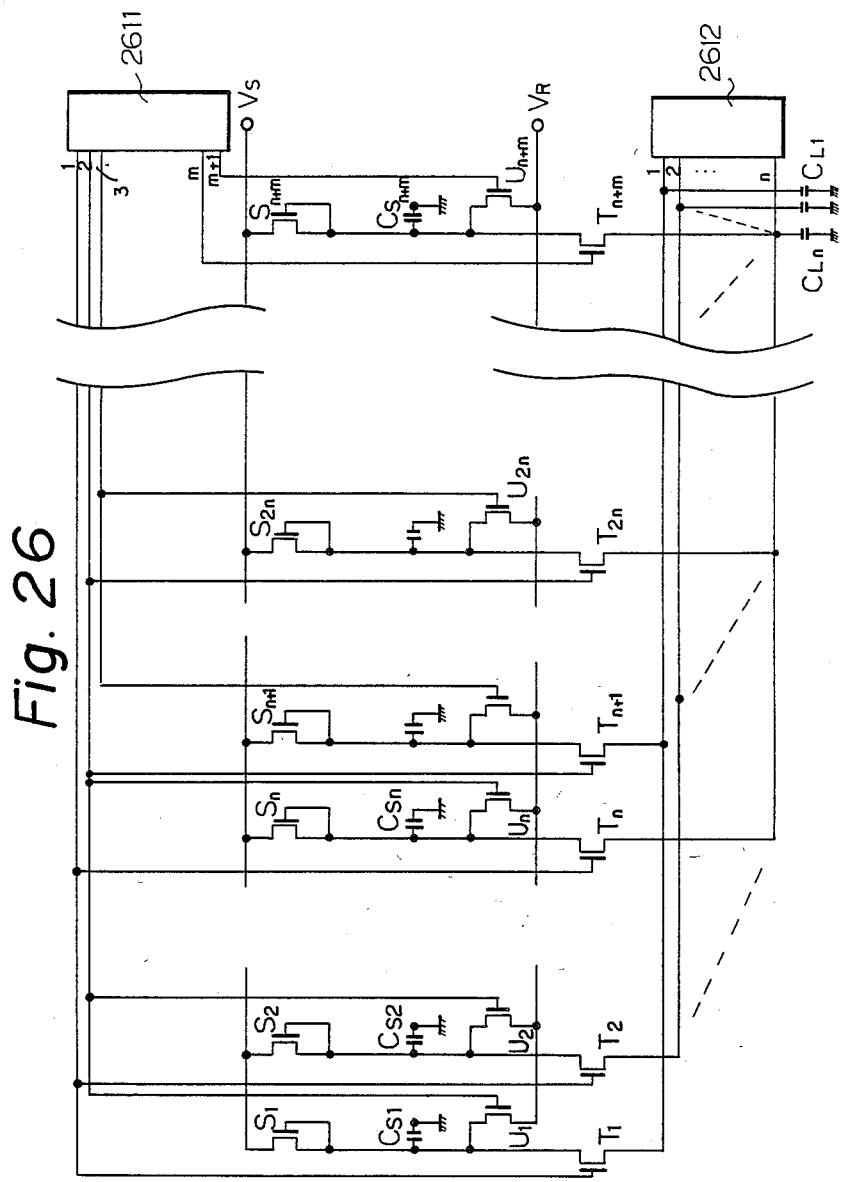
FIG. 26 is a circuit diagram showing the photoelectric converter of FIG. 25.

FIG. 26 is an equivalent circuit of a line sensor type photoelectric converter composed of n x m photoelectric converters of FIG. 25 disposed in array.

In the Figure, S1 to Snxm denote TFT type photoelectric conversion sections, $C_{S1}$ to $C_{Snxm}$ denote storage capacitors, U1 to Unxm denote rest TFTs, and T1 to Tnxm denote transfer TFTs.

The line sensor type photoelectric converter is divided into m blocks each having n element, m blocks being matrix connected to m +1 gate lines and n signal lines. In the Figure, reference numeral 2611 represents a driver section for sequentially applying voltage to gate lines $V_{G1}$ to $V_{Gm+1}$, 2612 a signal processing section for picking up signal voltage on signal lines S1 to Sn. $V_S$ denotes a sensor bias, $V_R$ denotes a reset voltage for the storage capacitor, and $C_{L1}$ to $C_{Ln}$ denote load capacitors.

In the circuit, a rest TFT U is provided which can fully rest the residual charge after the charge transfer into the storage capacitor $C_S$. The gage electrode of a rest TFT U is connected together to a gate electrode of a next block transfer TFT T. Simultaneously when a next block signal is transferred upon shifting of voltage pulses at the driver section 2611, the preceding block can be reset.

The circuit shown in FIG. 26 can be fabricated in a same substrate. More particularly, by using as the photoconductive semiconductor material an a-Si:H film formed by flow discharge, the TFT photoelectric conversion section, storage capacitor, transfer and reset TFTs, wiring leads and so on can be realized by simultaneous processes using a laminated structure of a lower electrode, an SiNH insulating layer, an a-Si:H layer, an n+ layer, and an upper electrode. The photoelectric converter of this invention is suitable for application to a line sensor type photoelectric converter made through simultaneous processes on a same substrate. An example of patterning a line sensor type photoelectric converter made through simultaneous processes of the above type will be described hereinbelow.

Figure 27:
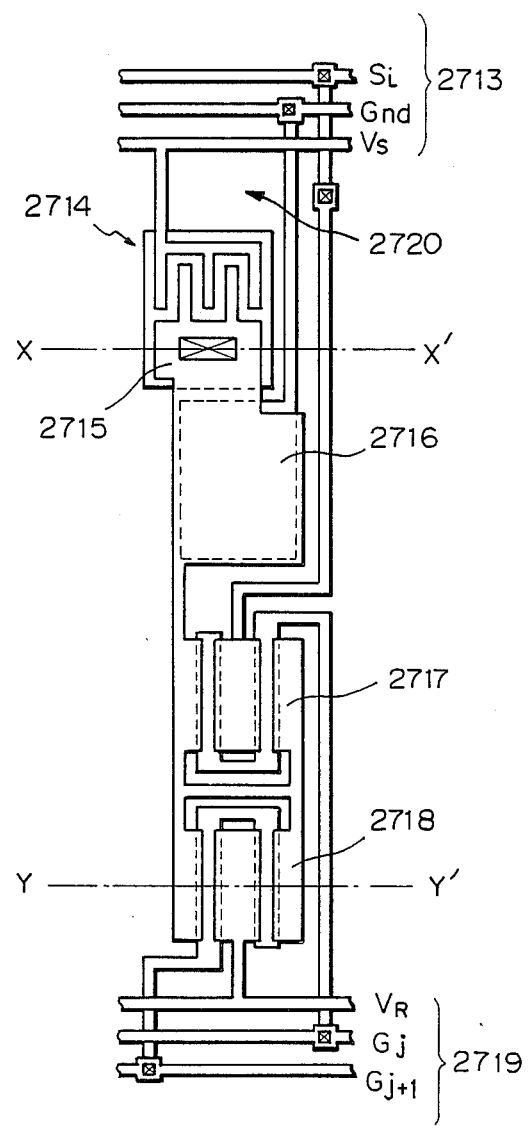
FIG. 27 is an enlarged patterning showing a part of the photoelectric converter of FIG. 25.

FIG. 27 shows a patterning of one bit of the circuit shown in FIG. 26, wherein only the upper and lower wiring leads and contact hole portions are shown in order not to make the drawing complicated. In the Figure, 2713 represents a signal matrix section, 2714 a photoelectric conversion section, 2715 a contact hole for gate and source, 2716 a storage capacitor, 2717 a transfer TFT, 2718 a reset TFT, 2719 a wiring lead for a gate drive line. In this example, a so-called lens-less structure is employed wherein an original is read by directly contacting it on a sensor section without using a focussing lens. Therefore, a window 2720 for applying light on an original is provided, and in addition the lower electrode of the photoelectric conversion section is made of transparent material which electrode serves also as a light shielding film. The transfer and reset TFTs 2717 and 2718 are disposed in mirror symmetrical relation to each other. The reason for this is that in case the alignment for the upper and lower electrodes is displaced in the longitudinal direction of the substrate, the gate-source capacitance of a pair of TFTs is compensated and maintained unchanged. A change in gate-source capacitance in the longitudinal direction results in the offset components of a signal output. With the above-described patterning, however, it is possible to remove the offset components. The load capacitor $C_{Li}$ (i=1 to n) in the equivalent circuit is not shown in FIG. 27. The value of the load capacitor is set at a value ten to several hundred times as large as the stray capacitance between signal lines S1 to Sn present at the signal matrix section 2713. It is also possible to use a load resistor as in the preceding embodiment and directly read a signal output in the form of current without using the load capacitor.

Figure 28:
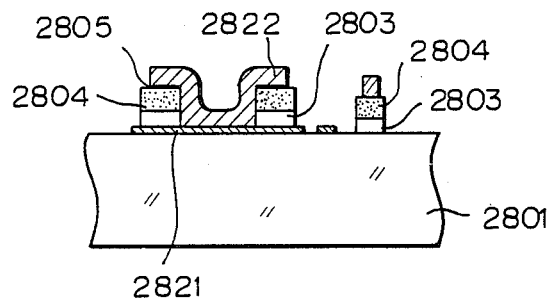
FIG. 28 is a cross section taken along line X—X' of FIG. 27.
Figure 29:
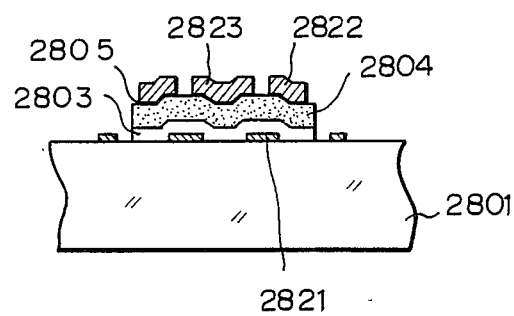
FIG. 29 is a cross section taken along line Y—Y' of FIG. 27.

FIG. 28 is a corss section taken along line X—X' of FIG. 27, and FIG. 29 is a cross section taken along line Y—Y' of FIG. 27. In the Figures, 2801 represents a substrate made of glass for example, 2821 represents a lower electrode which corresponds to a gate electrode of the photosensor in FIG. 28 and a gate electrode of a TFT in FIG. 29. An insulating film 2803 is made of SiNxH, SiO$_2$ or the like. A photoconductive semiconductor layer 2804 is made of a-Si:H or the like. An n+ layer 2805 is used for ohmic contact with the upper electrode. 2806 and 2807 represent upper electrodes which correspond to a source electrode of the photosensor in FIG. 28 and source and drain electrodes of a TFT in FIG. 29.

According to the embodiments 5 and 6 described so far, the gate and source electrodes are connected in common to each other. Therefore, the following and other effects can be obtained:

(1) Transient current does not flow during a storage operation. Thus, tha gamma λ value becomes 1 and a same and high S/N ratio as with a static operation can be obtained.

(2) A TFT photosensor, transfer and reset TFTs, storage capacitor and the like can be fabricated using simultaneous processes on a same substrate, to thereby realize a line sensor type photoelectric converter having a high performance and of low cost.

As described above, in the photoelectric converter according to this invention, dividing means for dividing the switching voltage applied to the control electrode of the discharge transistor to apply the resulting voltage to the auxiliary electrode is provided, so that a bias voltage is applied to the auxiliary electrode during the non-reading time interval of the photosensor, and a pulse voltage opposite in polarity to the bias voltage is added to the same to thereby eliminate the previous remaining read output in preparation for the next reading process.

Further, according to the photoelectric converter of this invention, since a negative bias can be applied to the third electrode, i.e., the gate electrode, the above-mentioned transient current can be eliminated and the light dependence characteristic λ can be made as near as 1, to thereby realize a photoelectric converter with a high S/N ratio and a good reproductiveness.

Furthermore, the photoelectric conversion section as well as the other elements can be fabricated on a same substrate using simultaneous processes, to thereby realize a line sensor type photoelectric converter with a high performance and of low cost.

Also, according to the photoelectric converter of this invention, since there is no transient current as discussed before, it is possible to have a gamma λ value of approximately 1, a high S/N ratio, and an excellent reproductiveness. Further, a drive circuit can be fabricated on a same substrate as of the photoelectric conversion section at a same time, to thereby realize a photoelectric converter with a high performance and of low cost.

We claim:

1. A photoelectric converter comprising:
   a photoelectric conversion unit comprising a pair of main electrodes, spaced by a photoreception area over a semiconductor layer, and an auxiliary electrode laminated with said semiconductor layer through the intermediary of an insulating layer in at least said photoreception area:
   a storage capacitor for storing electric charges flowing through said photoelectric conversion unit;
   a transfer transistor for transferring the charges stored in said storage capacitor;
   a discharge transistor comprising a control electrode for discharging the charges stored in said storage capacitor; and
   dividing means for dividing a switching voltage applied to said control electrode of said discharge transistor and for applying a divided voltage to said auxiliary electrode.

2. A photoelectric converter according to claim 1, wherein said dividing means includes said storage capacitor and further comprises:
   a capacitance formed between said auxiliary electrode and the storage capacitor connection side of the main electrodes of said photoelectric conversion unit; and
   a dividing capacitor connected across said auxiliary electrode and said control electrode of said discharge transistor,
   wherein voltage division is effected between the switching voltage and a reference voltage applied to said storage capacitor.

3. A photoelectric converter according to claim 1, wherein said dividing means includes series connected capacitors or series connected resistors connected across said control electrode of said discharge transistor and said storage capacitor, wherein voltage division is effected between the switching voltage and a reference voltage applied to said storage capacitor.

4. A photoelectric converter according to claim 1, wherein the semiconductor layer comprises an amorphous silicon hydride.

5. A photoelectric converter according to claim 1, wherein the transfer transistor comprises a thin film transistor.

6. A photoelectric converter according to claim 1, wherein the discharge transistor comprises a thin film transistor.

7. A photoelectric converter of claim 1, wherein the photoelectric conversion unit, the transfer transistor and the discharge transistor are formed on the same substrate.

8. A photoelectric converter of claim 7, wherein the substrate is of insulating type.

9. A photoelectric converter of claim 7, wherein the substrate is of light transmission type.

10. A photoelectric converter comprising a photoelectric conversion section comprising a photoconductive layer, an insulating layer, first and second electrodes facing said photoconductive layer, and a third electrode formed on said photoconductive layer, wherein said insulating layer is interposed between said photoconductive layer and said third electrode, wherein a supply voltage is applied to said first electrode to obtain a photoelectric conversion output from said second electrode, and wherein a capacitor is formed between said second electrode and said third electrode.

11. A photoelectric converter according to claim 10, wherein said first and second electrodes are formed on a same plane of said photoconductive layer.

12. A photoelectric converter according to claim 10 wherein said third electrode is applied with a bias voltage via a resistor or a switch element.

13. A photoelectric converter according to claim 10, wherein said photoconductive layer is made of an amorphous silicon hydride film.

14. A photoelectric converter according to claim 10, wherein said photoelectric converter comprises a plurality of said photoelectric conversion sections disposed in an array.

15. A photoelectric converter according to claim 12, wherein said switch element comprises a thin film transistor.

16. A photoelectric converter according to claim 15, wherein said thin film transistor comprises amorphous silicon hydride layer.

17. A photoelectric converter comprising a photoelectric conversion section comprising a photoconductive layer, first and second electrodes formed on one plane and facing said photoconductive layer, an insulating layer, and a third electrode formed on said photoconductive layer, wherein said insulation layer is interposed between said photoconductive layer and said third electrode, wherein a supply voltage is applied to said first electrode to obtain a photoelectric conversion output from said second electrode, and wherein said second electrode is commonly connected to said third electrode.

18. A photoelectric converter according to claim 17, wherein said photoconductive layer is made of an amorphous silicon hydride film.

19. A photoelectric converter according to claim 17, wherein said photoelectric converter comprises a plurality of said photoelectric conversion sections disposed in an array.

20. A photoelectric converter according to claim 17 further comprising a switch element and a storage capacitor electrically connected to said second electrode.

21. A photoelectric converter according to claim 20, wherein said switch element is constructed of a thin film transistor.

22. A photoelectric converter according to claim 21, wherein said thin film transistor has an amorphous silicon hydride layer.

23. A photoelectric converter comprising:
a photoelectric conversion section comprising a photoconductive layer, first and second electrodes facing to said photoconductive layer, and a third electrode formed on said photoconductive layer with an insulating layer interposed therebetween;
a capacitor formed between said second and third electrodes;
a storage capacitor electrically connected to said second electrode;
first switch means electrically connected to said second electrode for discharging said storage capacitor;
gate bias switch means electrically connected to said third electrode and actuated in cooperation with said switch means; and
second switch means electrically connected to said second electrode for charge transfer.

24. A photoelectric converter according to claim 23, wherein said photoelectric conversion section, said capacitor, said storage capacitor, said first switch means, said second switch means and said gate bias switch means are fabricated on a same substrate.

25. A photoelectric converter according to claim 23, wherein said photoconductive layer is made of an amorphous silicon hydride layer.

26. A photoelectric converter according to claim 24, wherein said first switch means is formed of a thin film transistor.

27. A photoelectric converter according to claim 24, wherein said second switch means is formed of a thin film transistor.

28. A photoelectric converter according to claim 24, wherein said gate bias switch means is formed of a thin film transistor.

29. A photoelectric converter according to claim 26, wherein said thin film transistor comprises amorphous silicon hydride layer.

30. A photoelectric converter according to claim 27, wherein said thin film transistor comprises amorphous silicon hydride layer.

31. A photoelectric converter according to claim 28, wherein said thin film transistor has an amorphous silicon hydride layer.

32. A photoelectric converter according to claim 24, wherein said substrate is made of an insulator.

33. A photoelectric converter according to claim 24, wherein said substrate comprises transparent.

* * * * *

UNITED STATES PATENT AND TRADEMARK OFFICE
CERTIFICATE OF CORRECTION

PATENT NO. : 4,886,977
DATED : December 12, 1989
INVENTOR(S) : IHACHIRO GOFUKU, ET AL.

It is certified that error appears in the above-identified patent and that said Letters Patent is hereby corrected as shown below:

COLUMN 1

Line 19, "converter" should read --converters--.
    Line 20, "(photosensor)" should read --(photosensors)--.
    Line 23, "requiring" should read --require--.
    Line 33, "like" should read --like.--.

COLUMN 2

Line 5, "TFTx" should read --TFTs--.

COLUMN 3

Line 40, "transfer switch SW." should read
         --transfer switch SW--.
    Line 43, "made" should be deleted.
    Line 54, "distored" should read --distorted--.
    Line 65, "0.5as" should read --0.5 as--.

COLUMN 6

Line 22, "denotes capacitances fromed" should read
         --denote capacitances formed--.
    Line 52, "voltage Vgi-Vgn" should read
         --voltages Vg1-Vgn--.

COLUMN 7

Line 42, "valued" should read --values--.

UNITED STATES PATENT AND TRADEMARK OFFICE
CERTIFICATE OF CORRECTION

PATENT NO. : 4,886,977

DATED : December 12, 1989

INVENTOR(S) : IHACHIRO GOFUKU, ET AL.

It is certified that error appears in the above-identified patent and that said Letters Patent is hereby corrected as shown below:

COLUMN 8

Line 25, "auxilairy" should read --auxiliary--.
    Line 32, "interval." should read --interval,--.
    Line 55, "auxilairy" should read --auxiliary--.

COLUMN 9

Line 10, "electorde" should read --electrode--.
    Line 22, "$V_G$follows" should read --$V_G$ follows--.
    Line 33, "$V_C \cdot \Delta V_{GS}$" should read --$V_C \cdot$ $\Delta V_{GS}$--.

COLUMN 11

Line 3, "soruce" should read --source--.
    Line 5, "changed" should read --change--.
    Line 13, "an" should read --the--.
    Line 17, "alone" should read --along--.

COLUMN 12

Line 33, "rest" should read --reset--.
    Line 34, "rest" should read --reset--.
    Line 36, "rest" should read --reset--.
    Line 44, "flow" should read --glow--.
    Line 67, "focussing" should read --focusing--.

COLUMN 13

Line 22, "corss" should read --cross--.
    Line 42, "tha" should read --the--.

UNITED STATES PATENT AND TRADEMARK OFFICE
CERTIFICATE OF CORRECTION

PATENT NO. : 4,886,977
DATED : December 12, 1989
INVENTOR(S) : IHACHIRO GOFUKU, ET AL.

Page 3 of 3

It is certified that error appears in the above-identified patent and that said Letters Patent is hereby corrected as shown below:

COLUMN 14

Line 63, "of" should read --according to--.
Line 67, "of" should read --according to--.

COLUMN 15

Line 1, "of" should read --according to--.
Line 32, "amorphous" should read --an amorphous--.

COLUMN 16

Line 43, "amorphous" should read --an amorphous--.
Line 46, "amorphous" should read --an amorphous--.
Line 54, "comprises" should read --is--.

Signed and Sealed this

Twenty-fifth Day of February, 1992

Attest:

HARRY F. MANBECK, JR.

*Attesting Officer*  *Commissioner of Patents and Trademarks*